United States Patent [19]
Feindt

[11] 4,019,121
[45] Apr. 19, 1977

[54] CIRCUIT ARRANGEMENT FOR PRODUCING A COMPENSATED CURRENT

[75] Inventor: Hans Heinrich Feindt, Pinneberg, Germany

[73] Assignee: U.S. Philips Corporation, New York, N.Y.

[22] Filed: Nov. 21, 1975

[21] Appl. No.: 634,256

[30] Foreign Application Priority Data
Dec. 14, 1974  Germany ............................ 2459271

[52] U.S. Cl. ..................................... 323/4; 330/22
[51] Int. Cl.² .......................................... G05F 1/56
[58] Field of Search ..................... 323/1, 4, 16, 19; 330/18, 19, 22, 30 D

[56] References Cited
UNITED STATES PATENTS

| | | |
|---|---|---|
| 3,838,262 | 9/1974 | Plassche .......................... 330/30 D |
| 3,914,684 | 10/1975 | Leidich .................... 323/4 |
| 3,922,614 | 11/1975 | Plassche .......................... 330/30 D |

*Primary Examiner*—A. D. Pellinen
*Attorney, Agent, or Firm*—Frank R. Trifari; George B. Berka

[57] ABSTRACT

A current, produced by a differential amplifier and proportional to a reference voltage and/or a reference value, is compensated for variation of the base-emitter voltage and of the current gain factor over a comparatively large control range, in that the common-emitter current of the differential amplifier is controlled proportionally to the output current with the aid of current mirror circuits.

6 Claims, 1 Drawing Figure

U.S. Patent
April 19, 1977
4,019,121
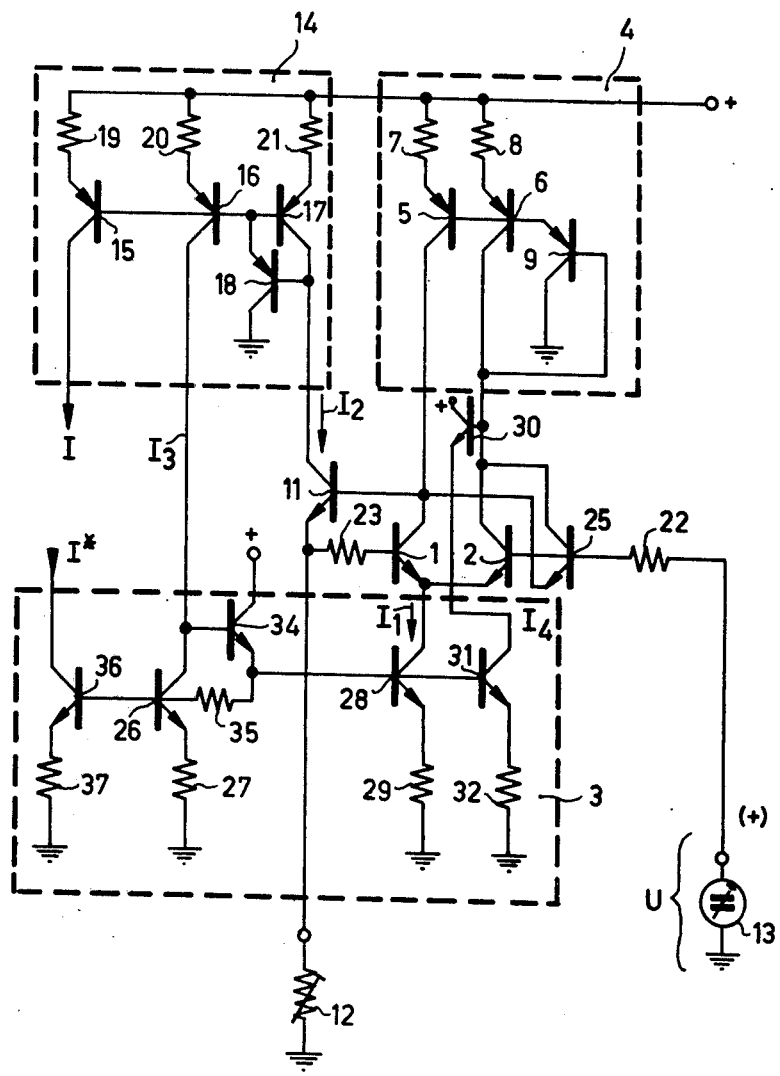

CIRCUIT ARRANGEMENT FOR PRODUCING A COMPENSATED CURRENT

The invention relates to a circuit arrangement for producing a current which is proportional to an adjustable reference voltage and/or the admittance of a variable resistor and which is highly compensated for temperature variations and, as the case may be, supply voltage variations, preferably employing the integrated semiconductor technology, the reference voltage being applied to the base of the first transistor of a differential amplifier and the base of the second transistor of the differential amplifier being connected to the emitter of a third transistor, whose base is connected to the collector of the second transistor and whose emitter circuit includes the resistor, while a (first) current mirror circuit is included between the collector circuits of the first and the second transistor.

In such circuit arrangements the influence of the base-emitter voltages and the temperature dependence thereof are compensated for, through only for a specific value of the input voltage or the resistor through which the output current flows.

In a circuit arrangement of the type mentioned in the preamble a compensation of said effects, over a wide range of the reference voltage and moreover, over a wide range of values of the variable resistor, is achieved when according to the invention the collector circuit of the third transistor supplies the output current and a control current for a third current mirror circuit via a second current mirror circuit, which third current mirror circuit determines the common emitter current of the first and the second transistor of the differential amplifier.

The invention will now be described in more detail with reference to an embodiment shown in the accompanying drawing.

The circuit arrangement includes two npn-transistors 1 and 2, whose emitters are interconnected and are connected to a negative terminal of the supply source (earth) via a sub-circuit 3 which supplies a constant current. Via a current mirror circuit 4 their collectors are connected to the positive terminal of the supply source. This current mirror circuit comprises two pnp-transistors 5 and 6, whose collectors are connected to the collectors of the transistors 1 and 2 and whose emitters are connected to the positive terminal of the supply source via resistors 7 and 8 respectively.

The current from the transistor 2 flows through the transistor 6 in such a way that for this current a correct base-emitter voltage is obtained for the relevant transistor type and temperature. When the collector of the transistor 6 is directly connected to the base thereof, a part of the applied current is branched off for the base current. In order to minimize this portion, the base of an additional pnp-transistor 9 is driven, whose collector is connected to earth, while its emitter supplies the base current to the transistor 6. The base-emitter voltage of the transistor 6 thus obtained, which voltage is dependent on the collector current of the transistor 2 and the voltage drop across the resistor 8 together influence the base of the transistor 5 and determine the sum of the base-emitter voltage and the voltage drop across the emitter resistor 7. When the resistor 7 and 8 are equal and the properties of the transistors 5 and 6 also correspond to each other, which is so to a high degree for integrated circuits, it is assured that a current flows to the collector of the transistor 1, which very accurately equals the collector current of the transistor 2.

An emitter amplifier with the transistor 11 is connected to the transistor 1 in such a way, that the base of transistor 11 is connected to the collector of the transistor 1 and the emitter transistor 11 to the base of the transistor 1. The emitter current of the transistor 11 causes a voltage drop across the resistor 12. As the currents of the transistors 1 and 2 are substantially equal owing to the current mirror circuit 4, the circuit is biassed so that the voltages appearing at the base electrodes of the transistors 1 and 2 also correspond to each other; thus the reference voltage U, which is only loaded by the base current of the transistor 2 and which is supplied by the current source 13, is transferred to the resistor 12 and the current of the transistor 11 is proportional to the product of the voltage U and the admittance of the resistor 12.

The output current of the transistor 11 can be applied to a current mirror circuit 14, which comprises pnp-transistors 15 and 16, whose collector currents are very accurately proportional to the input current, i.e. the collector current of the transistor 11, which flows through the pnp-transistor 17. The bases of the transistors 15, 16 and 17 are interconnected; their emitter circuits include the associated resistors 19, 20 and 21, with the aid of which the currents can be adjusted. The base and the emitter of a transistor 18 are connected to the collector and the base respectively of the transistor 17; the collector is connected to earth. This transistor 18 supplies the base currents for the transistors 15, 16 and 17; for this purpose a current component is derived from the control current $I_2$, which component is reduced by the value of the current gain of the transistor 18. The operation of the circuit 14 corresponds to that of the current mirror circuit 4, of which the transistor 5 is driven by the input current of the collector of the transistor 2 in a similar way.

In the circuit arrangement shown the base-emitter voltages are highly compensated in respect of their influence on the currents, but the base current for the transistor 11 is derived from the current supplied by the transistor 5 so that the collector current of transistor 1 is not exactly equal to the collector current of transistor 2. Accordingly, there will be a difference between the base voltages of the transistors 1 and 2. This may be compensated for by a small deviation in the value of the resistor 7 for a specific value of the base current of the transistor 11, i.e. for a specific voltage U. In the case of deviating values of U, however, different base currents will flow to the transistor 11. In conventional arrangements the current source circuit 3, which supplies the common current $I_1$ for the emitters of the transistors 1 and 2, is fixed. The collector currents of the transistors 1 and 2 then also remain unchanged. The current $I_2$ obtained at a different voltage U or a different admittance of the resistor 12, then demands a different base current of the transistor 11, so that the collector current of transistor 1 is changed relative to the current obtained from the transistor 5 via the current mirror circuit 4. For this other current, which deviates from the collector current of transistor 2, a different base current is obtained at the transistor 1 with a different voltage drop across the resistor 23 and the different base-emitter voltage at the transistor 1. The desired proportionality of the current $I_2$ and of the output current I relative to the input voltage U and/or the admittance of the resistor 12 is then no longer guaranteed.

According to the invention a current $I_3$ is taken from the current mirror circuit 14 by the transistor 16, which drives the transistor 26 in the current mirror circuit 3 and thus the current $I_1$ for the emitters of the transistors 1 and 2. Specifically with the aid of the emitter resistors 20, 27, 29 in the current mirror circuits 14 and 3, biassing is effected in such a way, according to the invention, that the current $I_1$ is twice as great as the current $I_2$. This can be achieved in that the currents $I_2$ and $I_3$ are made equal and the currents $I_1$ is twice as great as $I_3$. However, in principle, different ratios of $I_3$ and $I_2$ or $I_1$ are possible.

This circuit arrangement assures at the currents through the current mirror circuit 4 vary with the current $I_2$. When for example $I_2$ increases, the current through transistor 5 also increases and accordingly the compensating current component, adjusted by a deviating value of the resistor 7, increases, which component provides the base current for transistor 11, while the collector current of transistor 1 remains very accurately equal to the collector current of transistor 2.

Thus it is ensured that the desired compensation for the influences of the base-emitter voltages is maintained over a wide control range.

As a rule the voltage reference voltage source U will have an internal resistance 22, which may for example be produced owing to a voltage divider. In order to compensate for the voltage drop determined thereby and to exactly reproduce the voltage U across the resistor 12, a resistor 23, which is equal to the resistor 22, has been included in the base supply line of the transistor 1 in the circuit arrangement shown. The base currents to the transistors 1 and 2 produce the same voltage drop across these resistors, so that the desired correspondence of the resulting voltage is obtained.

When in the circuit arrangement shown the reference voltage U is zero, said currents also become zero. When a finite value of U is applied, a (positive) voltage will appear at the base of transistor 2, but because the current $I_1$ of the current source circuit 3 is zero, no currents will flow in the transistors 1 and 2 and the transistor 11 remains cut off. Therefore, for starting the circuit a transistor 25 is provided whose base and collector are connected to the base and collector of the transistor 2 and whose emitter is connected to the collector of transistor 1 and thus to the base of transistor 11.

When subsequently voltage U is supplied, transistor 25 is turned on, so that transistor 11 become conductive. Then a current $I_2$ will flow and via the current mirror circuits 14 and 3 the current $I_1$ is also introduced. As the base voltages of the transistors 1 and 2 are equal, the base of transistor 11 will become more positive than the voltage at the base of transistor 2 owing to the connection between the emitter of transistor 11 and the base of transistor 1: the npn-transistor 25 then obtains a voltage which is 0.6 V more negative relative to the emitter and is cut off.

The base of the input transistor 26 of the current mirror circuit 3 which is controlled by the current $I_3$ may furthermore be connected to the base of a npn-transistor 36, whose emitter is connected to earth via resistor 37. Then, a current I* will flow to the collector thereof, which is proportional to the output current I, but which is of opposite polarity.

The base current of the transistor 11 takes up a part of the current supplied to the transistor 1 by the current mirror circuit 4, so that the collector current thereof is a corresponding amount smaller. This difference between the collector currents of the transistors 1 and 2 can be compensated for by modifying the emitter areas and thus the emitter current densities or by correspondingly adjusted currents of the transistors 5 and 6 in the current mirror circuit, for example with the aid of the emitter resistors 7 and 8. A more accurate compensation, however, is possible when the current to the transistor 6 in the current mirror circuit 4 is corrected relative to the collector current of transistor 2 in a corresponding manner. This can be effected by connecting the base of a transistor 30 whose collector is connected to supply source (+) to the collector of transistor 2, a current which equals the current $I_2$ being applied to the emitter of the transistor 30 by a transistor 31 with an emitter resistor 32. As according to the invention the currents $I_1$ and $I_2$ are proportional to each other, the base of transistor 31 may be connected to the base of transistor 28, the desired magnitude of the current $I_4$ from transistor 31 to transistor 30 for example being obtained with the aid of the resistor 32.

In the circuit arranged described so far, there is also a certain dependence of the current gain factor B of the various transistors, which in its turn depends on the currents ($I_1$, $I_2$, $I_3$, $I_4$). This dependence can be reduced substantially, when the collector of the transistor 26 which is controlled by the control current $I_3$, as the case may be with the aid of an emitter amplifier 34, is connected to the base of said input transistor 26 via a resistor 35 and when the end of the resistor 35 which is remote from said base is connected to the base of the transistor 28 which supplies the common current $I_1$ for the emitters of the transistors 1, 2 of the differential amplifiers. The value of this base resistor 35 being preferably equal to the value of the resistor 27 which is included in the emitter circuit of the transistor 26.

What is claimed is:

1. A transistor circuit arrangement for producing a current which is proportional to an adjustable reference voltage and/or the admittance of a variable resistor, and which is compensated for temperature variations and supply voltage variations, comprising: a differential amplifier including a first transistor to the base of which the reference voltage is applied, and a second transistor; a third transistor the emitter circuit of which is connected to the base of the second transistor and includes the variable resistor while the base of which is connected to the collector of the second transistor; a first current mirror circuit supplied by the supply voltage and connected between the collector circuits of the first and the second transistor; a second current mirror circuit supplied by the supply voltage and connected to the collector circuit of the third transistor to supply a control current $I_2$ thereto, said second current mirror circuit further supplying an input current $I_3$ and an output current I; and a third current mirror circuit supplied by said input current $I_3$ and connected to the emitter circuits of the first and the second transistor to determine a common emitter current $I_1$ thereof.

2. A circuit arrangement according to claim 1, wherein the input current $I_3$ of the third current mirror circuit is substantially equal to the control current $I_2$ and the common emitter current $I_1$ is twice the control current $I_2$.

3. A circuit arrangement as claimed in claim 1, wherein from the third current mirror circuit at least a current I* is taken, which is proportional to the output current and of opposite polarity.

4. A circuit arrangement as claimed in claim 1, wherein the base supply line of the second transistor of the differential amplifier includes a resistor, whose value at least approximately equals the internal resistance of the source of the reference voltage.

5. A circuit arrangement as claimed in claim 1, wherein the input current $I_3$ of the third current mirror circuit is applied to the collector of an input transistor the base of which is connected via a resistor, to the emitter of a transistor amplifier and to the base of a transistor which supplies the common current $I_1$ for the emitters of the first and the second transistor of the differential amplifier, the value of said base resistor being preferably equal to the value of the resistor included in the emitter circuit of said input transistor.

6. A circuit arrangement as claimed in claim 1, wherein the base of the first transistor which is connected to the reference voltage, is connected to the base of an auxiliary transistor, whose collector is connected to the collector of the first transistor and whose emitter is connected to the collector of the second transistor of the differential amplifier.

* * * * *